(12) United States Patent
Jang et al.

(10) Patent No.: US 8,030,225 B2
(45) Date of Patent: Oct. 4, 2011

(54) HEAT TREATMENT METHOD FOR PREVENTING SUBSTRATE DEFORMATION

(75) Inventors: In Goo Jang, Goyang-si (KR); Yoo Jin Lee, Yongin-si (KR); Dong Jee Kim, Seongnam-si (KR)

(73) Assignee: TG Solar Corporation, Hwaseong-Si, Gyeonggi-Do (KR)

( * ) Notice: Subject to any disclaimer, the term of this patent is extended or adjusted under 35 U.S.C. 154(b) by 0 days.

(21) Appl. No.: 12/922,827

(22) PCT Filed: Mar. 16, 2009

(86) PCT No.: PCT/KR2009/001296
§ 371 (c)(1),
(2), (4) Date: Sep. 15, 2010

(87) PCT Pub. No.: WO2009/116763
PCT Pub. Date: Sep. 24, 2009

(65) Prior Publication Data
US 2011/0039421 A1    Feb. 17, 2011

(30) Foreign Application Priority Data
Mar. 17, 2008   (KR) ................. 10-2008-0024567

(51) Int. Cl.
*H01L 21/324* (2006.01)
(52) U.S. Cl. ........ 438/795; 438/109; 438/502; 438/664; 257/686; 257/E21.324; 257/E33.075
(58) Field of Classification Search ................. 438/109, 438/457, 502, 509, 660–664, 530, 540, 550, 438/522, 795–799; 257/686, E21.077, E21.082, E21.333, E21.12, E21.324, E21.454, E21.497, E33.075, FOR. 119, FOR. 407, FOR. 408, FOR. 242, FOR. 334
See application file for complete search history.

(56) References Cited

U.S. PATENT DOCUMENTS
5,068,156 A * 11/1991 Ogata .......................... 428/620
6,724,967 B2 * 4/2004 Ouellet et al. ................ 385/130
2004/0055152 A1 * 3/2004 Fraivillig ......................... 29/830

FOREIGN PATENT DOCUMENTS
JP      58176928        10/1983
KR      20020070826     9/2002
KR      20060045830     5/2006

* cited by examiner

*Primary Examiner* — Matthew Smith
*Assistant Examiner* — Walter H Swanson
(74) *Attorney, Agent, or Firm* — Mannava & Kang, PC; Hyunho Park

(57) ABSTRACT

A heat treatment method which can prevent heat deformation of a substrate caused during a heat treatment process on the substrate with a thin film formed on its surface is provided. The heat treatment method in accordance with the present invention includes (a) stacking a second substrate 10b on a first substrate 10a; and (b) stacking a weight 20 on the second substrate 10b, wherein the first substrate 10a and the second substrate 10b are stacked, with thin films 12 of the substrates 10a and 10b being in contact with each other. In accordance with the present invention, deformation of the substrate can be prevented by stacking the substrates, with thin films formed on the substrates being in contact with each other, and placing a weight on the stacked substrates during the heat treatment process.

13 Claims, 7 Drawing Sheets

(a)

(b)

HEAT TREATMENT METHOD FOR PREVENTING SUBSTRATE DEFORMATION

PRIORITY

The present application claims priority under 35 U.S.C. §371 to PCT Application PCT/KR2009/001296, filed on Mar. 16, 2009, which claims priority to Korean Patent Application No. 10-2008-0024567, filed on Mar. 17, 2008, the disclosures of which are hereby incorporated by reference in their entireties.

TECHNICAL FIELD

The present invention relates to a heat treatment method. More particularly, the present invention relates to a heat treatment method, which can prevent deformation of a substrate by stacking the substrates, with thin films formed on the substrates being in contact with each other, and placing a weight on the stacked substrates.

BACKGROUND ART

An annealing apparatus used for fabrication of semiconductors, flat panel displays, and solar cells is an apparatus which is in charge of an essential heat treatment step to perform processes such as crystallization, phase change, etc. on a thin film deposited on a substrate, such as a silicon wafer or glass.

For example, in a liquid crystal display and a thin film crystalline silicon solar cell, a silicon crystallization apparatus for crystallizing amorphous silicon deposited on a glass substrate into polysilicon is a typical annealing apparatus. Typically, a minimum temperature of 550 to 600° C. is required for crystallization of amorphous silicon.

That is, in general, an annealing apparatus is a heat treatment apparatus for applying heat to a thin film formed on a substrate, whereby heat is applied to the substrate as well as to the thin film.

However, a problem of this typical heat treatment method is that warpage of the substrate is caused by differences in thermal expansion coefficient between the substrate and the thin film in a cooling step after the heat treatment process. Particularly, in the case of using a glass substrate having a low melting point, such as flat plane displays or solar cells, warpage of the substrate is more problematic. This warpage of the substrate directly affects the productivity of flat plane displays or solar cells.

FIG. 1 is a view showing the problem of a conventional heat treatment method, wherein FIG. 1(a) is a view showing the state of a substrate before heat treatment, and FIG. 1(b) is a view showing the state of a substrate deformed by heat treatment.

As shown in FIG. 1(a), a crystallization heat treatment process is carried out under a condition where, for example, an amorphous silicon thin film 12 is formed on a glass substrate 10. When the crystallization heat treatment process is carried out under the condition of FIG. 1(a), this causes a problem, as shown in FIG. 1(b), that the substrate is deformed while being bent toward a portion having a low thermal expansion coefficient in a cooling step after the heat treatment process because the thermal expansion coefficients of the substrate 10 and the thin film 12 are different from each other.

DISCLOSURE

Technical Problem

It is, therefore, an object of the present invention to provide a heat treatment method, which can prevent deformation of a substrate by stacking substrates, with thin films formed on the substrates being in contact with each other, and placing a weight on the stacked substrates during a heat treatment process.

Technical Solution

In accordance with one aspect of the present invention, there is provided a heat treatment method for heat-treating a thin film formed on a substrate, the method including the steps of: (a) stacking a second substrate on a first substrate; and (b) stacking a weight on the second substrate, wherein the first substrate and the second substrate are stacked, with thin films of the substrates being in contact with each other.

In accordance with another aspect of the present invention, there is provided a heat treatment method for heat-treating a thin film formed on a substrate, the method including the steps of: (a) stacking a second substrate on a first substrate; and (b) stacking a weight on the second substrate, wherein the first substrate and the second substrate are stacked, with a thin film of the first substrate being in contact with a bottom surface of the second substrate.

In accordance with still another aspect of the present invention, there is provided a heat treatment method for heat-treating a thin film formed on a substrate, the method including the steps of: (a) stacking a second substrate on a first substrate; and (b) stacking a weight on the second substrate, wherein the first substrate and the second substrate are stacked, with a thin film of the second substrate being in contact with a bottom surface of the first substrate.

The heat treatment method can further include the step of continuously stacking an additional substrate on the second substrate after completion of the step (a).

In accordance with still another aspect of the present invention, there is provided a heat treatment method for heat-treating a thin film formed on a substrate, the method including the steps of: (a) preparing a first substrate and a second substrate of a first group; (b) stacking the second substrate of the first group on the first substrate of the first group; (c) preparing a first substrate and a second substrate of a second group; (d) stacking the first substrate of the second group on the second substrate of the first group; (e) stacking the second substrate of the second group on the first substrate on the second group; and (f) stacking a weight on the second substrate of the second group, wherein the first and second substrates in each group are stacked, with thin films of the substrates being in contact with each other, and the first and second substrates in different groups are stacked such that thin films of the substrates are not in contact with each other.

In the heat treatment method, the weight can be a quartz plate.

The heat treatment method can further include the step of continuously stacking a first substrate and a second substrate of an additional group on the second substrate of the second group after completion of the step (e).

In the heat treatment method, a separator plate can be installed between the first substrate and the second substrate in different groups.

In the heat treatment method, the separator plate can be made of quartz.

In the heat treatment method, a corrugated portion can be formed on a surface of the separator plate.

Advantageous Effects

In accordance with the present invention, deformation of a substrate can be prevented by stacking substrates, with thin films formed on the substrates being in contact with each other, and placing a weight on the stacked substrates during a heat treatment process.

Moreover, in accordance with the present invention, deformation of a substrate caused during a heat treatment process can be prevented, thereby improving the productivity of flat panel displays or solar cells.

Furthermore, in accordance with the present invention, since a heat treatment process is performed on a plurality of substrates, with thin films formed on the substrates being in contact with each other, the working capacity of heat treatment process increases, thereby improving the productivity of flat panel displays or solar cells and lowering their manufacturing cost.

DESCRIPTION OF DRAWINGS

The above and other objects and features of the present invention will become apparent from the following description of the preferred embodiments given in conjunction with the accompanying drawings, in which:

FIG. 1 is a view showing the problem of a conventional heat treatment method, wherein FIG. 1(a) is a view showing the state of a substrate before heat treatment, and FIG. 1(b) is a view showing the state of a substrate deformed by heat treatment;

BEST MODE FOR THE INVENTION

Hereinafter, the configuration of the present invention will be described in detail with reference to the accompanying drawings.

Figure 1:
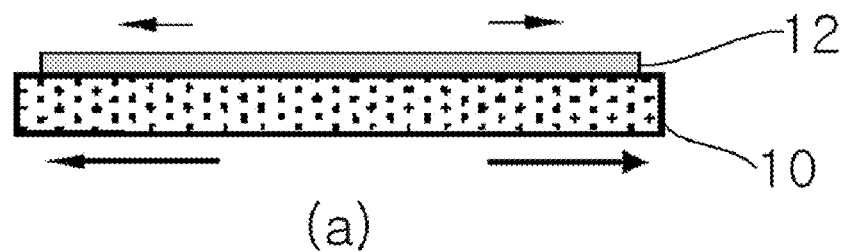
Figure 1:
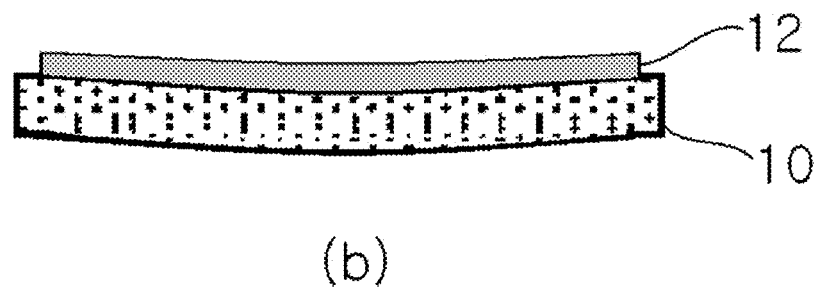
Figure 2:
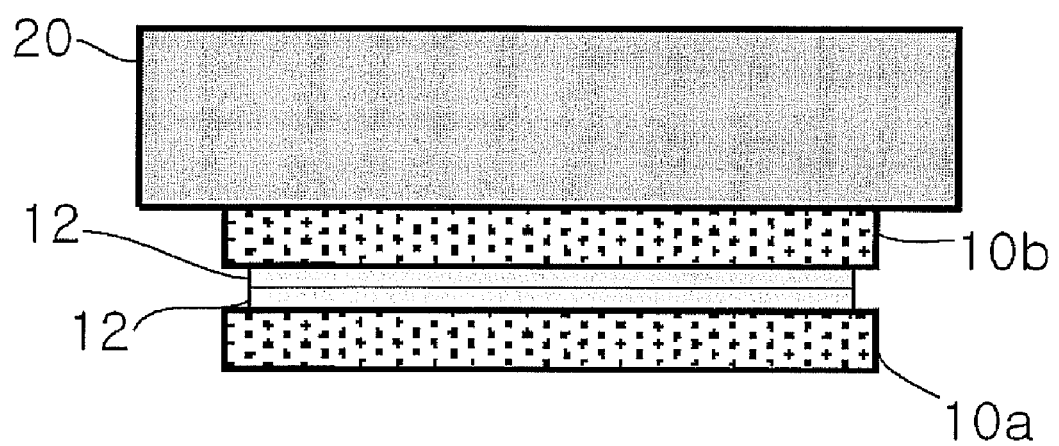
FIG. 2 is a view showing the configuration of a heat treatment method in accordance with a first embodiment of the present invention.

FIG. 2 is a view showing the configuration of a heat treatment method in accordance with a first embodiment of the present invention. As shown therein, the heat treatment method in accordance with this embodiment is characterized in that a heat treatment process is performed under a condition where a first substrate 10a and a second substrate 10b are stacked, with thin films 12 respectively formed on the first substrate 10a and the second substrate 10b being in contact with each other, and a weight 20 having a predetermined mass is placed on top of the second substrate 10b.

Figure 3:
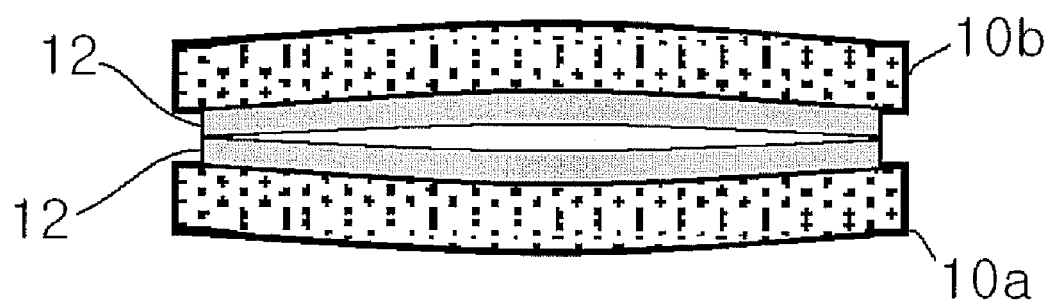
FIG. 3 is a view showing the problem aroused when a heat treatment process is performed without the weight of FIG. 2.

In this embodiment, the weight 20 serves to apply a uniform load over the entire area of the first and second substrates 10a and 10b in order to suppress deformation of the first substrate 10a and the second substrate 10b, as shown in FIG. 3, due to differences in thermal expansion coefficient between the substrates 10a and 10b and the thin films 12. FIG. 3 is a view showing the problem aroused when a heat treatment process is performed without the weight of FIG. 2.

The weight 20 is preferably made of a material, e.g., quartz, which is resistant to heat applied to the first and second substrates 10a and 10b loaded on a heat treatment apparatus during the heat treatment process, and is not reactive to the first and second substrates 10a and 10b in a high temperature environment, but the present invention is not limited thereto. Preferably, the weight 20 has an area equal to or greater than the area of the first or second substrate 10a or 10b in order to apply uniform load over the entire first and second substrates 10a and 10b.

Figure 4:
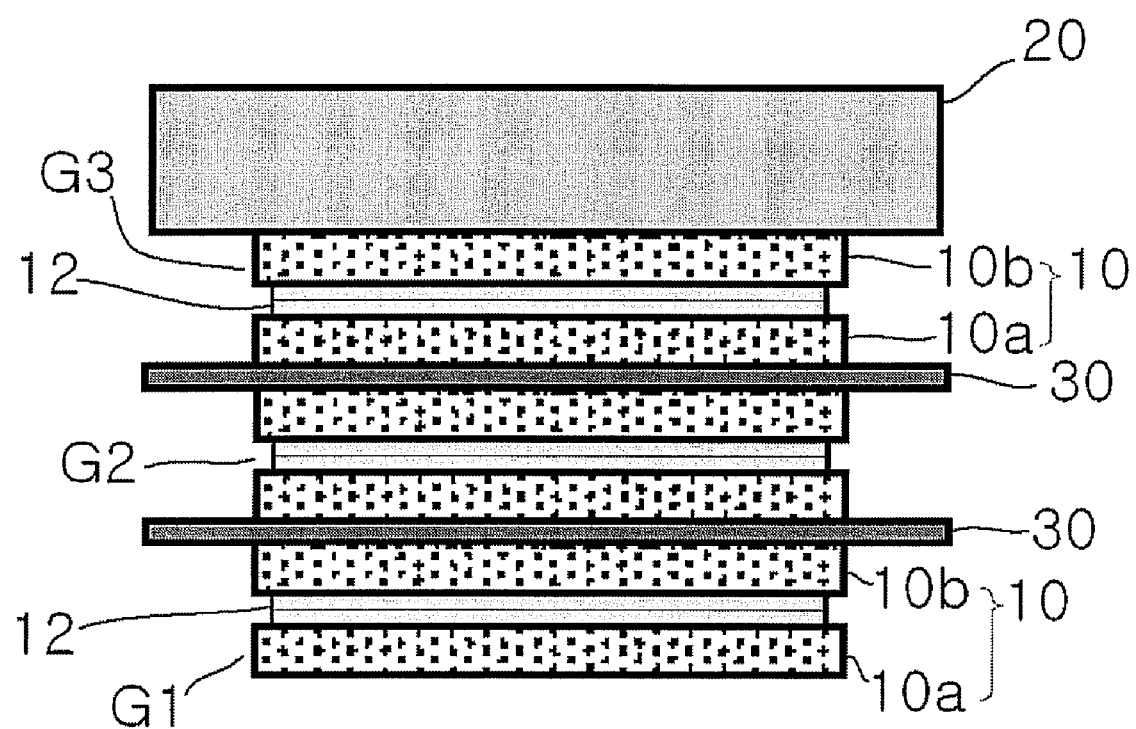
FIG. 4 is a view showing the configuration of a heat treatment method in accordance with a second embodiment of the present invention.

FIG. 4 is a view showing the configuration of a heat treatment method in accordance with a second embodiment of the present invention. As shown therein, the heat treatment method in accordance with this embodiment is characterized in that a heat treatment process is performed under a condition where a first group G1 is constituted by stacking a pair of a first substrate 10a and a second substrate 10b, with thin films 12 formed on the substrates 10a and 10b being in contact with each other, a second group G2 and a third group G3 each constituted by stacking a first substrate 10a and a second substrate 10b are sequentially stacked on the first group G1 in the same manner as the first group G1, and then a weight 20 having a predetermined mass is placed on top of the second substrate 10b of the third group G3. Herein, the number of groups to be stacked is not limited to three, it may be properly adjusted, exceeding three depending on the number of substrates required for one batch to be loaded on a heat treatment apparatus.

That is, the first substrate 10a and second substrate 10b in each group are stacked, with thin films 12 formed on the substrates 10a and 10b being in contact with each other. Moreover, the first substrate 10a and second substrate 10b in different groups are stacked under a condition that thin films 12 formed on the substrates 10a and 10b are not in contact with each other.

The function, material, and area of the weight 20 in this embodiment are identical to those in the first embodiment of the present invention explained in connection with FIG. 2. However, this embodiment is different from the first embodiment in that the substrates of the group disposed right above a certain group may function as a weight. That is, referring to FIG. 4, the substrates of the first group G1 are restrained from deformation by the load of the substrates of the second group G2 disposed right above the first group G1, and the substrates of the second group G2 are restrained from deformation by the load of the substrates of the third group G3 disposed right above the second group G2.

Meanwhile, as shown in FIG. 4, a heat treatment process is preferably performed under a condition where a separator plate 30 is additionally installed between the groups. In this embodiment, the separator plate 30 serves to prevent the first substrate 10a and second substrate 10b in each group from being melted and stuck to those in other groups during the heat treatment process. Particularly, in case where the substrates are made of glass, if a heat treatment temperature during the heat treatment process only reaches a softening temperature of glass, the first substrate 10a and second substrate 10b between each group, whose surfaces are in contact with each other, are stuck to result in a phenomenon that the substrates cannot be separated from each other. This can be suppressed by disposing the separator plate 30 between the groups.

The separator plate 30 is preferably made of a material, e.g., quartz, which is resistant to heat applied to the first and second substrates 10a and 10b of a plurality of groups loaded on the heat treatment apparatus during the heat treatment process, and is not reactive to the first and second substrates 10a and 10b in a high temperature environment, but the present invention is not limited thereto.

Figure 5:
FIG. 5 is a view showing the configuration of a separator plate in accordance with the second embodiment of the present invention.

In addition, as shown in FIG. 5, the separator plate 30 preferably has a corrugated portion on its surface. This is to make it easier to separate the first and second substrates 10a and 10b of each group from those in other groups after the heat treatment process by reducing the contact area between the first and second substrates 10a and 10b and the separator plate 30. A sand blasting process for blasting abrasive sand on the separator plate 30 at a predetermined pressure and speed may be used as a method of forming a corrugated portion on the separator plate 30, but the present invention is not necessarily limited thereto.

Figure 6:
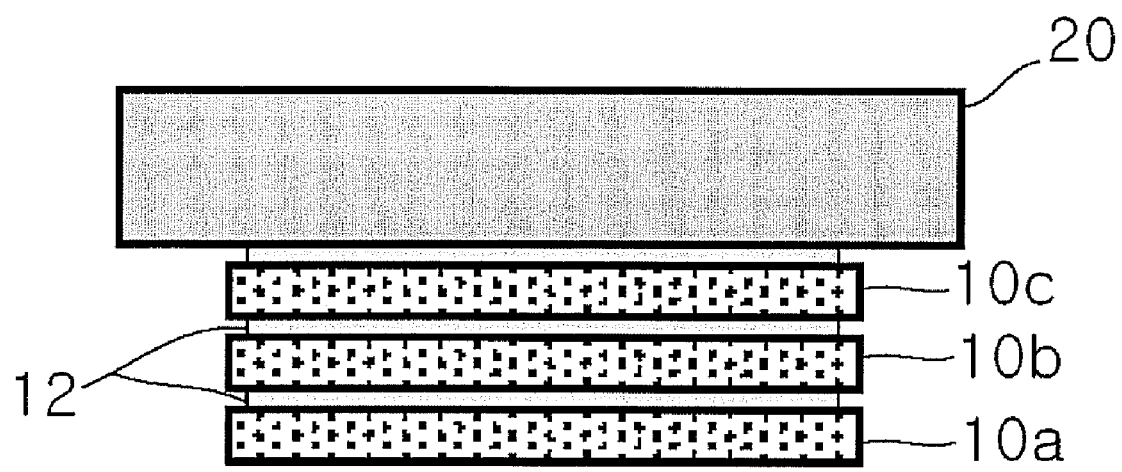
FIG. 6 is a view showing the configuration of a heat treatment method in accordance with a third embodiment of the present invention.

FIG. 6 is a view showing the configuration of a heat treatment method in accordance with a third embodiment of the present invention. As shown therein, the heat treatment method in accordance with this embodiment is characterized in that a heat treatment process is performed under a condition where a first to a third substrates 10a, 10b, and 10c are sequentially stacked such that a thin film 12 formed on the first substrate 10a is in contact with a bottom surface of the second substrate 10b stacked on top of the first substrate 10a, and a thin film 12 formed on the second substrate 10b is in contact with a bottom surface of the third substrate 10c stacked on top of the second substrate 10b, and then a weight 20 having a predetermined mass is placed on the third substrate 10c. Herein, the number of groups to be stacked is not limited to three, it may be properly adjusted, exceeding three depending on the number of substrates required for one batch to be loaded on a heat treatment apparatus.

Figure 7:
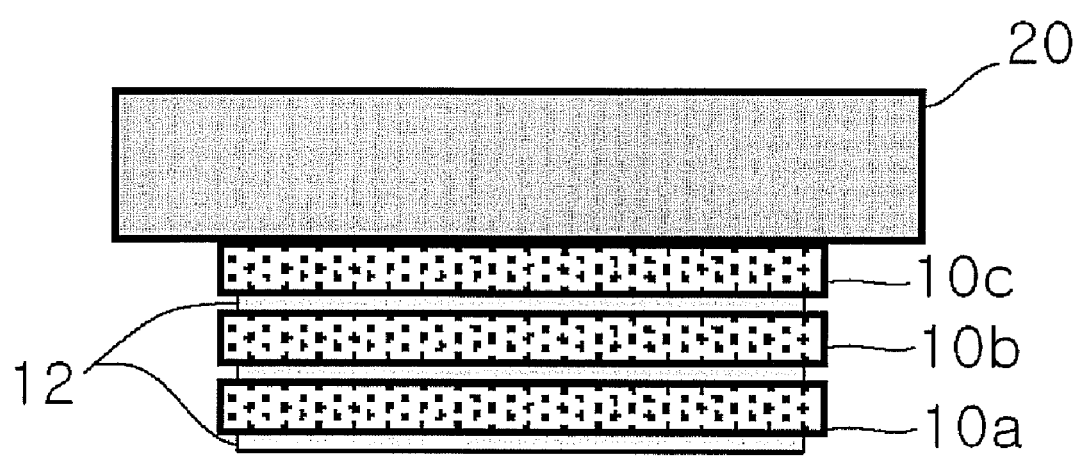
FIG. 7 is a view showing the configuration of a heat treatment method in accordance with a fourth embodiment of the present invention.

FIG. 7 is a view showing the configuration of a heat treatment method in accordance with a fourth embodiment of the present invention. As shown therein, in the heat treatment method in accordance with this embodiment, heat treatment is performed by stacking substrates reversely with respect to those of the third embodiment. That is, the heat treatment method in accordance with this embodiment is characterized in that a heat treatment process is performed under a condition where a first to a third substrates 10a, 10b, and 10c are sequentially stacked such that a thin film 12 formed on the second substrate 10b is in contact with a bottom surface of the first substrate 10a stacked under the second substrate 10b, and a thin film 12 formed on the third substrate 10c is in contact with a bottom surface of the second substrate 10b stacked under the third substrate 10c, and then a weight 20 having a predetermined mass is placed on the third substrate 10c. Herein, the number of groups to be stacked is not limited to three, it may be properly adjusted, exceeding three depending on the number of substrates required for one batch to be loaded on a heat treatment apparatus, like the third embodiment.

The function, material, and area of the weight 20 in the third and fourth embodiments are identical to those in the first embodiment of the present invention explained in connection with FIG. 2.

Accordingly, the heat treatment method in accordance with the present invention can prevent warpage of a substrate caused by differences in thermal expansion coefficient between the substrate and a thin film in a cooling step after the heat treatment process, and, as a result, can improve the productivity of flat panel displays or solar cells. Moreover, since the heat treatment process is performed on a plurality of substrates, with thin films formed on the substrates being in contact with each other, the working capacity of heat treatment process increases, thereby improving the productivity of flat panel displays or solar cells and lowering their manufacturing cost.

While the invention has been shown and described with respect to the preferred embodiments, it will be understood by those skilled in the art that various changes and modification may be made without departing from the spirit and scope of the invention as defined in the following claims.

What is claimed is:

1. A heat treatment method for heat-treating a thin film formed on a substrate, the method comprising the steps of:
   (a) stacking a second substrate on a first substrate, wherein a thin film of the first substrate is in contact with the first substrate; and
   (b) stacking a weight on the second substrate, wherein a thin film of the second substrate is in contact with the second substrate, and
   wherein the first substrate and the second substrate are stacked, with the thin film of the first substrate being in direct contact with the thin film of the second substrate.

2. The method of claim 1, wherein the weight is a quartz plate.

3. A heat treatment method for heat-treating a plurality of thin films formed on a plurality of substrates, the method comprising the steps of:
   stacking a second substrate on a first substrate, wherein the second substrate and the first substrate are stacked, with a thin film of the first substrate being in direct contact with both the first substrate and the second substrate;
   stacking a third substrate on the second substrate, wherein the third substrate and the second substrate are stacked, with a thin film of the second substrate being in direct contact with both the second substrate and the third substrate; and
   stacking a weight on the third substrate,
   wherein the weight and the third substrate are stacked, with a thin film of the third substrate being in direct contact with both the third substrate and the weight.

4. The method of claim 3, wherein the weight is a quartz plate.

5. A heat treatment method for heat-treating a plurality of thin films formed on a plurality of substrates, the method comprising the steps of:
   stacking a second substrate on a first substrate, wherein the second substrate and the first substrate are stacked, with a thin film of the second substrate being in direct contact with both the second substrate and the first substrate, and wherein a thin film of the first substrate is in direct contact with the first substrate on a side of the first substrate where the thin film of the second substrate is not in contact;
   stacking a third substrate on the second substrate, wherein the third substrate and the second substrate are stacked, with a thin film of the third substrate being in direct contact with both the third substrate and the second substrate; and
   stacking a weight on the second third substrate.

6. The method of claim 5, wherein the weight is a quartz plate.

7. A heat treatment method for heat-treating a thin film formed on a substrate, the method comprising the steps of:
   (a) preparing a first substrate and a second substrate of a first group;
   (b) stacking the second substrate of the first group on the first substrate of the first group;
   (c) preparing a first substrate and a second substrate of a second group;
   (d) stacking the first substrate of the second group on the second substrate of the first group;

(e) stacking the second substrate of the second group on the first substrate of the second group; and (f) stacking a weight on the second substrate of the second group, wherein the first and second substrates in each group are stacked, with thin films of the substrates being in contact with each other, and the first and second substrates in different groups are stacked such that the thin films of the substrates are not in contact with each other.

8. The method of claim 7, further comprising the step of:

preparing a first substrate and a second substrate of an additional group;

stacking the second substrate of the additional group on the first substrate of the additional group; and stacking the first substrate and the second substrate of the additional group on the second substrate of the second group after completion of said step (e).

9. The method of claim 8, wherein a separator plate is installed between the first substrate and the second substrate in different groups.

10. The method of claim 7, wherein a separator plate is installed between the first substrate and the second substrate in different groups.

11. The method of claim 10, wherein the separator plate is made of quartz.

12. The method of claim 10, wherein a corrugated portion is formed on a surface of the separator plate.

13. The method of claim 7, wherein the weight is a quartz plate.

* * * * *